(12) United States Patent
Nagashima

(10) Patent No.: US 8,149,609 B2
(45) Date of Patent: Apr. 3, 2012

(54) NONVOLATILE SEMICONDUCTOR MEMORY DEVICE

(75) Inventor: Hiroyuki Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 200 days.

(21) Appl. No.: 12/721,007

(22) Filed: Mar. 10, 2010

(65) Prior Publication Data

US 2010/0238708 A1 Sep. 23, 2010

(30) Foreign Application Priority Data

Mar. 23, 2009 (JP) .................. 2009-070846

(51) Int. Cl.
*G11C 11/00* (2006.01)
*G11C 7/00* (2006.01)

(52) U.S. Cl. ......... 365/148; 365/163
(58) Field of Classification Search .......... 365/148, 365/163, 189.16
See application file for complete search history.

(56) References Cited

U.S. PATENT DOCUMENTS

| 7,345,907 B2* | 3/2008 | Scheuerlein | 365/148 |
| 2004/0264244 A1* | 12/2004 | Morimoto | 365/180 |
| 2009/0010039 A1* | 1/2009 | Tokiwa et al. | 365/148 |

FOREIGN PATENT DOCUMENTS

| JP | 5-174584 | 7/1993 |
| JP | 9-231777 | 9/1997 |
| JP | 11-176183 | 7/1999 |
| JP | 2004-185756 | 7/2004 |
| JP | 2005-522045 | 7/2005 |
| JP | 2005-235360 | 9/2005 |
| JP | 2007-335068 | 12/2007 |
| JP | 2009-26364 | 2/2009 |

OTHER PUBLICATIONS

Office Action issued Jun. 7, 2011, in Japan Patent Application No. 2009-070846 (with English translation).
Japanese Office Action issued Sep. 13, 2011, in Patent Application No. 2009-070846 (with English translation).

* cited by examiner

*Primary Examiner* — Anh Phung
(74) *Attorney, Agent, or Firm* — Oblon, Spivak, McClelland, Maier & Neustadt, L.L.P.

(57) ABSTRACT

A nonvolatile semiconductor memory device comprising: a memory cell array including memory cells each provided at individual intersection between a first wiring and a second wiring, the memory cell comprising a variable resistive element, and predetermined numbers of the memory cells sharing the same first wiring to configure a page; a first control circuit configured to select a page subjected to data-writing, and to supply a constant voltage to the first wiring belonging to the selected page; a writing-voltage generating circuit configured to generate plural kinds of writing voltages for programming a resistance of the variable resistive element to one of three or more values based on a write-in data specifying three or more values; and a second control circuit configured to select the page subjected to data-writing, and to supply the writing voltages to predetermined numbers of the respective second wirings belonging to the selected page.

20 Claims, 6 Drawing Sheets

NONVOLATILE SEMICONDUCTOR MEMORY DEVICE

CROSS-REFERENCE TO RELATED APPLICATION

This application is based upon and claims the benefit of priority from the prior Japanese Patent Application No. 2009-70846, filed on Mar. 23, 2009, the entire contents of which are incorporated herein by reference.

BACKGROUND OF THE INVENTION

1. Field of the Invention

The present invention relates to a nonvolatile semiconductor memory device, and more particularly, a nonvolatile semiconductor memory device using memory cells each comprising a variable resistive element storing multivalued data.

2. Description of the Related Art

Flash memories which includes a cell array having memory cells with a floating gate structure connected in a NAND connection manner or a NOR connection manner are conventionally well-known as nonvolatile memories that are electrically rewritable. Moreover, ferroelectric memories are also known as memories which are nonvolatile and enable a fast-speed random access.

As a technology for further refinement of memory cells, there is proposed a resistance-changeable memory having a memory cell comprised of a variable resistive element. Examples of such a variable resistive element are a phase-change memory element which changes a resistance in accordance with a state-change between crystal/amorphous of chalcogenide compounds, an MRAM element which changes a resistance by a tunnel magnetic resistance effect, a memory element of a polymeric ferroelectric RAM (PFRAM) which has a resistive element formed of conductive polymers, an ReRAM element (see JP2006-344349A, paragraph 0021) which changes a resistance by application of electric pulses.

The resistance-changeable memories have a memory cell which can be configured by a series circuit of a schottky diode and a variable resistive element instead of transistors, so that stacking is facilitated and a three-dimensional structure can be employed, thereby accomplishing further integration (see JP2005-522045A).

A capacity can be increased by controlling the state of a resistive element in each memory cell to be a multivalued state equal to three values or greater from a high resistive state to a low resistive state.

Such resistance-changeable memories comprise memory cells each of which is provided at an intersection between each of plural word lines and each of plural bit lines which intersect one another and which stores multivalued data. In writing of data in the resistance-changeable memories, in general, a predetermined bit line is selected, a writing pulse in accordance with write-in data of greater than or equal to three values is applied to a word line, thereby changing the resistive state of a variable resistive element of a predetermined memory cell. In this case, however, only a memory cell connected to a selected word line and a bit line can accept write-in of data at a time. Accordingly, in order to realize page write-in that data is written in a page unit comprised of plural memory cells, it is necessary to serially write in data one memory cell by one memory cell belonging to the page, so that it requires a long processing time to write in data.

SUMMARY OF THE INVENTION

A nonvolatile semiconductor memory device according to a first aspect of the present invention comprises: a memory cell array including plural first and second wirings intersecting one another, and memory cells each provided at individual intersection between the first wiring and the second wiring, the memory cell comprising a variable resistive element, and predetermined numbers of the memory cells sharing the same first wiring to configure a page; a first control circuit configured to select a page of the memory cell array subjected to data-writing based on an address, and to supply a constant voltage to the first wiring belonging to the selected page; a writing-voltage generating circuit configured to generate plural kinds of writing voltages for programming a resistance of the variable resistive element to one of three or more values based on a write-in data specifying three or more values; and a second control circuit configured to select the page of the memory cell array subjected to data-writing based on the address, and to supply the writing voltages generated by and output from the writing-voltage generating circuit to predetermined numbers of the respective second wirings belonging to the selected page.

A nonvolatile semiconductor memory device according to a second aspect of the present invention comprises: a memory cell array including plural first and second wirings intersecting one another, and memory cells each provided at individual intersection between the first wiring and the second wiring, the memory cell comprising a variable resistive element configured to store, as data, one of three or greater resistance values in a nonvolatile manner, and predetermined numbers of the memory cells sharing the same first wiring to configure a page; an input buffer configured to store an address and data both input externally; a first control circuit configured to select the first wiring connected to the memory cells configuring a page of the memory cell array subjected to data-writing based on an address input via the input buffer, and to supply a constant voltage to the selected first wiring; a pulse generator configured to simultaneously generate plural kinds of writing pulses, each of the writing pulses being one of three kinds or more of writing voltages corresponding to data specifying three or more values, to be supplied to the plurality of respective second wirings connected to the memory cells configuring a page subjected to data-writing based on data input via the input buffer; and a second control circuit configured to select the plurality of second wirings connected to the memory cells configuring the page of the memory cell subjected to data-writing based on the address input via the input buffer, and to supply the plural kinds of writing pulses generated by the pulse generator to the respective plural selected second wirings.

A nonvolatile semiconductor memory device according to a third aspect of the present invention comprises: a memory cell array including plural first and second wiring intersecting one another, and memory cells each provided at individual intersection between the first wiring and the second wiring, the memory cell comprising a variable resistive element; a writing-voltage generating circuit configured to generate and output plural kinds of writing voltages for programming a resistance of the variable resistive element to one of three or more values based on write-in data specifying three or more values; and a writing circuit configured to write pieces of data in the respective memory cells using the respective writing voltages output from the writing-voltage generating circuit, and the writing circuit configured to select the plural memory cells commonly connected to the same first wiring among the plurality of memory cells, and to supply the writing voltages on the basis of pieces of data to be written in the plural respective selected memory cells to the respective second wirings connected to the individual memory cells.

DETAILED DESCRIPTION OF THE EMBODIMENT

An explanation will be given of an embodiment of the present invention with reference to the accompanying drawings.

Embodiment

Whole Configuration

Figure 1:
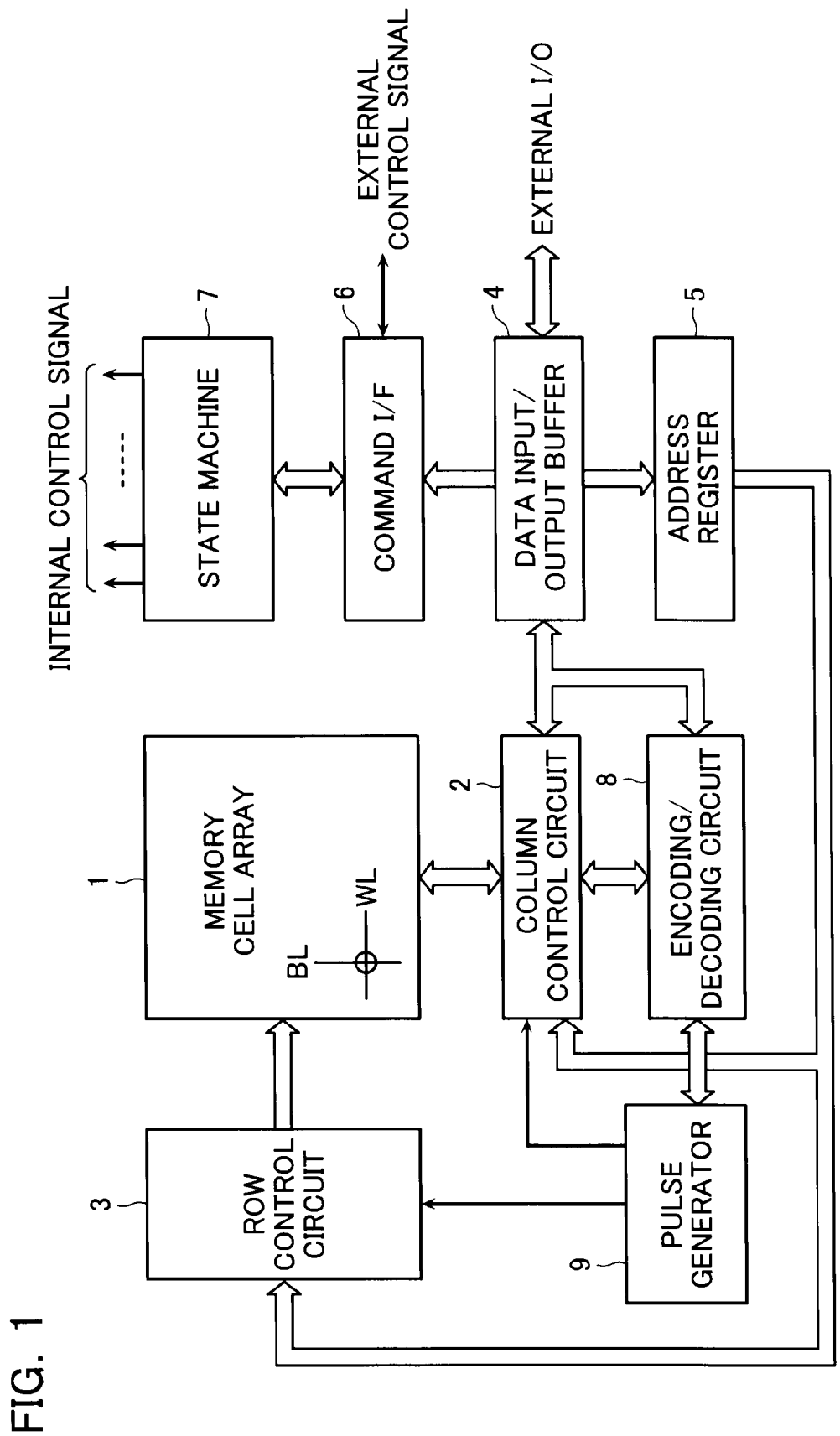
FIG. 1 is a block diagram showing a nonvolatile memory according to an embodiment of the present invention.

FIG. 1 is a block diagram showing a nonvolatile memory according to an embodiment of the present invention.

The nonvolatile memory includes a memory cell array 1 having memory cells arranged in a matrix manner. Each memory cell comprises a variable resistive element to be discussed later. A column control circuit 2 which is a second control circuit of controlling a bit line BL of the memory cell array 1, erasing data from a memory cell, writing data in a memory cell, and reading out data from a memory cell is provided at a position adjacent to the memory cell array 1 in a direction of the bit line BL. Moreover, a row control circuit 3 which is a first control circuit of selecting a word line WL of the memory cell array 1, and of applying a voltage, which is necessary for erasing data from a memory cell, writing data in a memory cell, and reading out data from a memory cell, is provided at a position adjacent to the memory cell array 1 in a direction of the word line WL.

A data input/output buffer 4 is connected to an external host (not illustrated) via an I/O line, receives write-in data, receives an erase instruction, outputs read-out data, and receives address data or command data. The data input/output buffer 4 forwards received write-in data to the column control circuit 2, receives data read out from the column control circuit 2 and outputs such data externally. An address supplied from the exterior to the data input/output buffer 4 is forwarded to the column control circuit 2 and the row control circuit 3 via an address register 5. Moreover, a command supplied from the host to the data input/output buffer 4 is forwarded to a command interface 6. The command interface 6 receives an external control signal from the host, determines whether data input to the data input/output buffer 4 is write-in data, a command, or an address, and transfers such data as a command signal to a state machine 7 if such data is a command. The state machine 7 manages the whole nonvolatile memory, receives a command from the host, and manages read-out, write-in, erasing, and input/output of data.

Data input from the host to the data input/output buffer 4 is transferred to an encoding/decoding circuit 8, and an output signal by the encoding/decoding circuit 8 is input into a pulse generator 9 which is a write-in voltage generating circuit. This input signal causes the pulse generator 9 to output a writing pulse with a predetermined voltage and a predetermined timing. A pulse generated and output by the pulse generator 9 is transferred to the column control circuit 2 and an arbitrary wiring selected by the row control circuit 3.

Among the above-explained blocks, the column control circuit 2, the row control circuit 3, and the pulse generator 9 work together to function as a write-in circuit.

<Memory Cell Array and Peripheral Circuit>

Figure 2:
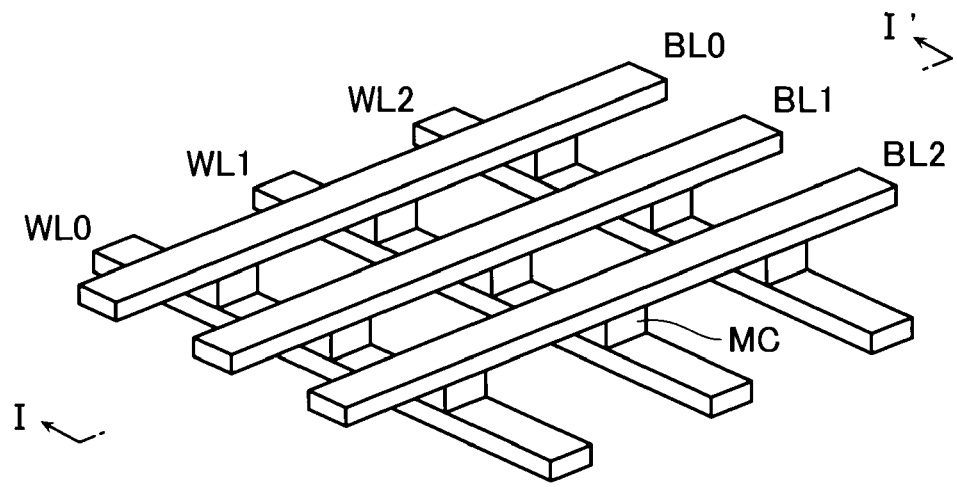
FIG. 2 is a perspective view showing a part of a memory cell array in the embodiment.
Figure 3:
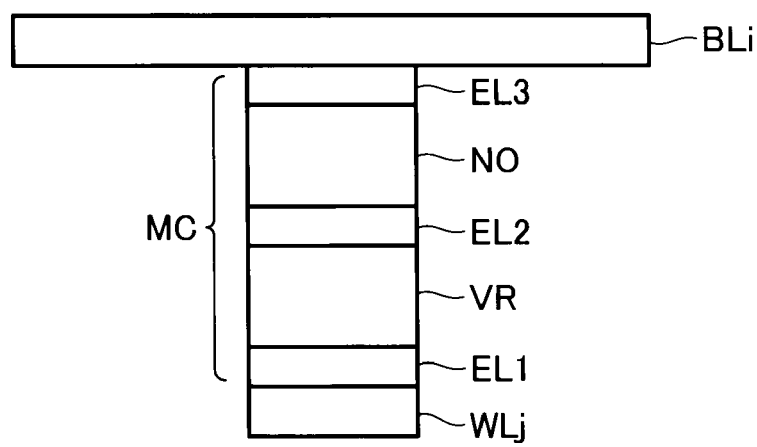
FIG. 3 is a cross-sectional view by what corresponds to one memory cell cut along a line I-I' in FIG. 2 and viewed in the direction of an arrow.

FIG. 2 is a perspective view showing a part of the memory cell array 1, and FIG. 3 is a cross-sectional view by what corresponds to one memory cell 1 cut along a line I-I' in FIG. 2 and viewed in the direction of an arrow.

Word lines WL0 to WL2 which are plural first wirings are arranged in parallel with one another, and bit lines BL0 to BL2 which are plural second wirings intersecting the word lines are arranged in parallel with one another. A memory cell MC is arranged at each intersection so as to be sandwiched by both word line WL and bit line BL. It is desirable that the first and second wirings are formed of a material which is tolerant of heat and has a low resistance, and examples of such a material are W, WSi, and CoSi.

As shown in FIG. 3, the memory cell MC comprises a series circuit of a variable resistive element VR and a non-ohmic element NO.

The variable resistive element VR changes a resistance through a current, heat, or chemical energy by application of a voltage, and electrodes EL1, EL2 which function as a barrier metal and a bonding layer are provided thereabove and therebelow, respectively. Examples of a material of the electrode are Pt, Au, Ag, TiAlN, SrRuO, Ru, RuN, Ir, Co, Ti, TiN, TaN, LaNiO, Al, PtIrO$_x$, PrRhO$_x$, and Rh/TaAlN. Moreover, it is possible to insert a metal film which makes the orientation uniform. Furthermore, additional buffer layer, barrier metal layer, bonding layer and the like can be inserted.

Regarding the variable resistive element VR, one like chalcogenide which changes a resistance based on a phase transition between a crystalline state and a non-crystalline state (PRAM), and one which is a composite compound containing cations to be transition elements and which changes a resistance as the cations move can be used.

Figure 4:
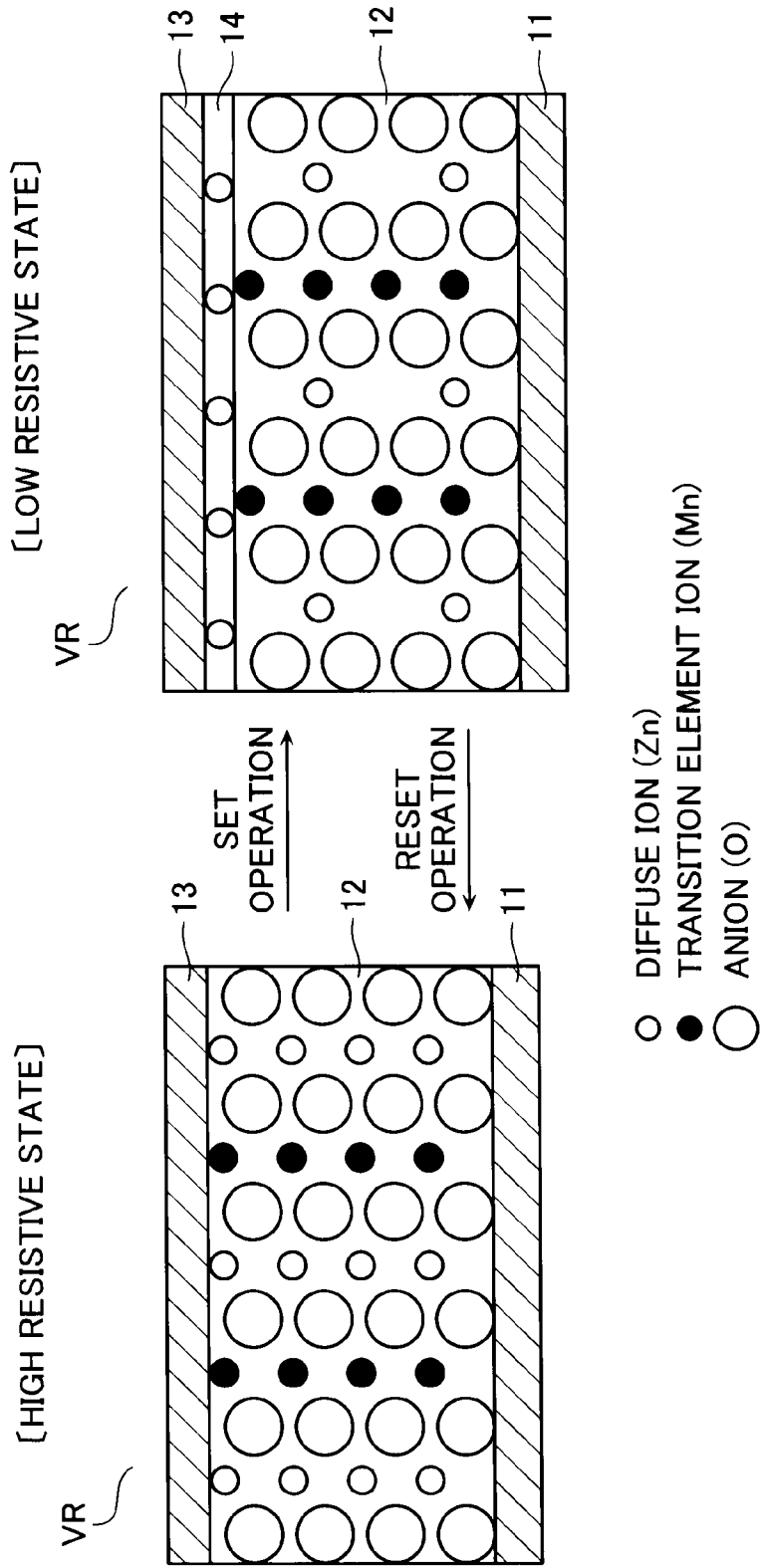
FIG. 4 is an exemplary cross-sectional view showing an example of a variable resistive element in the embodiment.

FIG. 4 shows an example of the latter variable resistive element. The variable resistive element VR shown in FIG. 4 has a recording layer 12 arranged between electrode layers 11, 13. The recording layer 12 comprises a composite compound containing at least two kinds of cation elements. At least one kind of the cation elements is a transition element having a d orbital which is incompletely filled with electrons, and a minimum distance between adjoining cation elements is equal to 0.32 nm or less. More specifically, the composite compound is a material having a crystalline structure expressed by a chemical formula $A_xM_yX_z$ (where A and M are elements different from each other), such as a spinel structure ($AM_2O_4$), an ilmenite structure ($AMO_3$), a delafossite structure ($AMO_2$), an LiMoN$_2$ structure ($AMN_2$), a wolframite structure (AMO$_4$), an olivine structure (A$_2$MO$_4$), a hollandite structure (A$_x$MO$_2$), a ramsdellite structure (A$_x$MO$_2$), and a perovskite structure (AMO$_3$).

In the example shown in FIG. 4, A is Zn, M is Mn, and X is O. A tiny white circle in the recording layer 12 is a diffuse ion (Zn), a large white circle is a anion (O), and a tiny black circle is a transition element ion (Mn). The initial state of the recording layer 12 is a high-resistive state, but as a negative voltage is applied to the electrode 13 side with the electrode 11 being set to be a fixed potential, some of the diffuse ions in the recording layer 12 move toward the electrode 13 side, and the number of diffuse ions in the recording layer 12 relatively decreases with respect to the number of anions. The diffuse ions moved to the electrode 13 side receive electrons from the electrode 13, and are subjected to precipitation as a metal, thereby forming a metal layer 14. In the recording layer 12, the number of anions becomes excessive, and as a result, the bottom layer of the transition element ions in the recording layer 12 is raised. Accordingly, the recording layer 12 has an electron conductivity as carriers are supplied, and then a setting operation completes. Regarding reproduction, it is fine if a tiny current which does not cause the material of the recording layer 12 to change a resistance is allowed to flow. To reset a program state (low-resistive state) to the initial state (high-resistive state), for example, a large current is allowed to flow through the recording layer 12 for a sufficient time to cause Joule heating and to promote an oxidation-reduction reaction of the recording layer 12. Moreover, a reset operation can be carried out by applying an electrical field in a reverse direction at the time of setting.

The non-ohmic element NO comprises, for example, various diodes, such as a schottky diode, a PN junction diode, and a PIN diode, an MIM (Metal-Insulator-Metal) structure, or an SIS (Silicon-Insulator-Silicon) structure. Electrodes EL2, EL3 which form a barrier metal layer and a bonding layer may be also inserted. When a diode is used, due to its characteristics, a unipolar operation can be carried out, and when an MIM structure or an SIS structure is used, a bipolar operation can be carried out. Note that the arrangement of the non-ohmic element NO and the variable resistive element VR can be changed upside down with respect to FIG. 3, and the polarities of the non-ohmic element NO can be changed upside down.

<Resistance Distribution of Memory Cell>

Figure 5A:
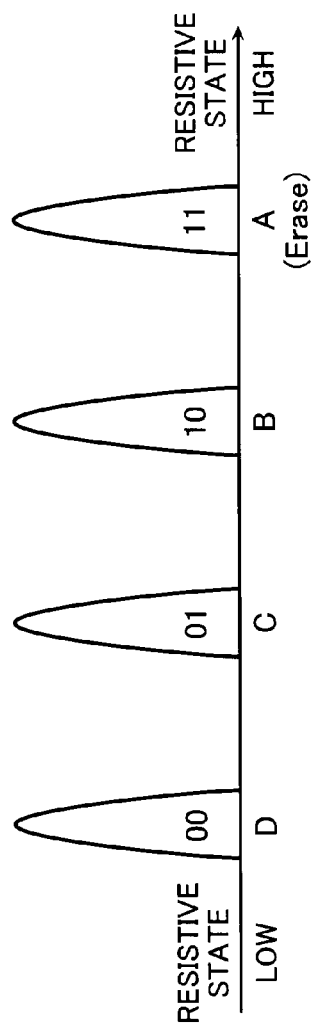
FIGS. 5A to 5C are graphs showing a relationship between a resistance distribution of a memory cell and data in the embodiment.
Figure 5B:
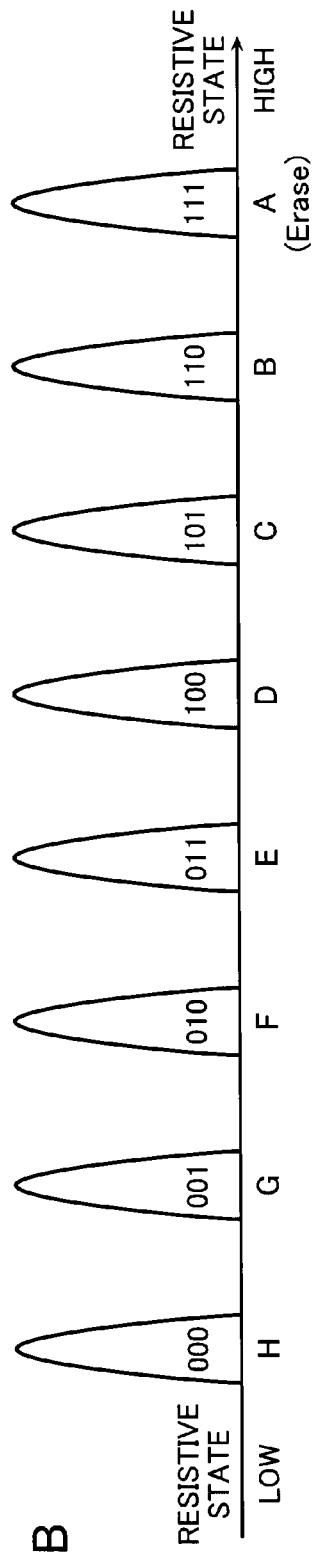
Figure 5C:
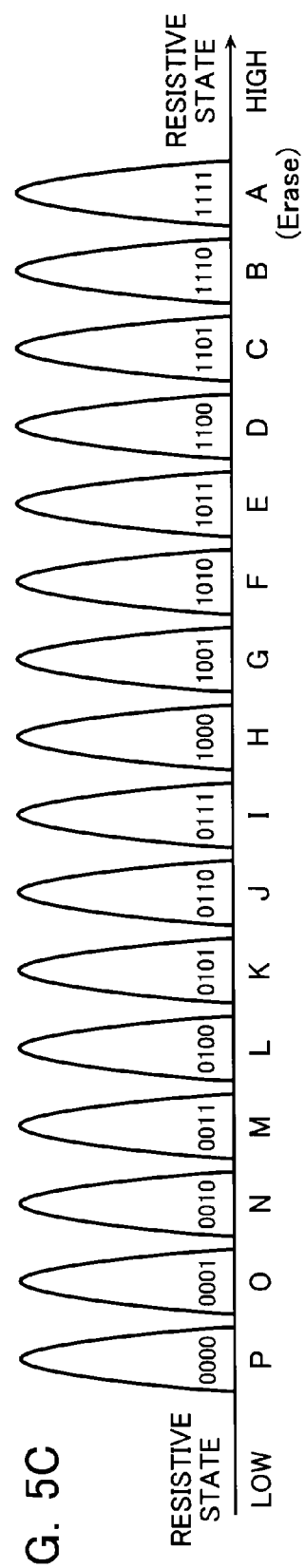

FIGS. 5A to 5C are graphs showing a relationship between a resistance distribution of a memory cell storing multiple values and data. FIG. 5A is for an example case in which each memory cell MC stores two-bit data, and a write-in operation is performed on each memory cell MC so that pieces of data are within respective four resistance distributions A to D. Pieces of two-bit data "11", "10", "01", and "00" correspond to respective distributions from the highest-resistance distribution A to the lowest one in this order. FIG. 5B is for an example case in which three-bit data are stored in each memory cell MC, and a write-in operation is performed on each memory cell MC so that pieces of data are within respective eight resistance distributions A to H. Pieces of three-bit data "111", "110", "101", "100", "011", "010", "001", and "000" correspond to respective distributions from the highest-resistance distribution A to the lowest one in this order. FIG. 5C is for an example case in which four-bit data is stored in each memory cell MC, and a write-in operation is performed on each memory cell MC so that pieces of data are within respective 16 resistance distributions A to P. Pieces of four-bit data "1111", "1110", "1101", "1100", . . . , "0011", . . . , "0010", "0001", and "0000" correspond to respective distributions from the highest-resistance distribution A to the lowest one in this order.

<Page Write-in Operation of Multivalued Data>

Next, an explanation will be given of a write-in operation of multivalued data in the nonvolatile memory.

When multivalued data is to be written in, a write-in data is input from the host to the data input/output buffer 4. At this time, it is supposed that data input is performed in the storage-bit-number unit per one cell of multivalued data. For example, when four values per one cell are to be stored, write-in data is input from the host by the two bits. Data input from the host is received by the data input/output buffer 4, and is transferred to the encoding/decoding circuit 8. The input data may be decoded by the encoding/decoding circuit 8 and forwarded to the pulse generator 9, or external input data may be directly forwarded to the pulse generator 9 as it is (in this case, encoding/decoding circuit 8 becomes unnecessary). The pulse generator 9 generates a writing pulse to acquire any resistance level among levels A to D in FIG. 5A based on the input data. The pulse is transferred to a bit line BL selected by the column control circuit 2 at a write-in timing controlled by the state machine 7, and a write-in operation is then performed.

Next, with reference to FIG. 6 which is an equivalent circuit diagram showing a part of the memory cell array 1, an explanation will be given of batch data writing in a page comprising the plural memory cells.

The memory cell array 1 has the plurality of word lined WL1 to WL3, the plurality of bit lines BL1 to BL3 intersecting the word lines WL1 to WL3, and the plurality of memory cells MC provided at individual intersections between the word line WL and the bit line BL.

Each memory cell MC comprises a series circuit of a diode Di having a cathode connected to the word line WL, and the variable resistive element VR connected between the anode of the diode Di and the bit line BL.

In those memory cells MC, a plurality of memory cells MC sharing one word line WL configure one page.

Batch data writing in a page is carried out by applying a constant word-line selecting voltage Vsetw1 to a word line WL shared by the memory cells MC belonging to the page to select the word line WL, and by simultaneously applying writing pulses WP each having a different electrical energy in accordance with write-in data to individual bit lines BL connected to individual memory cells MC. Note that regarding how to apply pulses, various methods, such as a method of simultaneously applying writing pulses WP to the plurality of bit lines BL while applying the word-line selecting voltage Vsetw1 to a word line EL, a method of simultaneously applying writing pulses EP to a word line WL and bit lines BL, and a method of applying a negative pulse to the word line WL while applying different writing pulses WP to the plurality of bit lines BL, can be adopted.

As a specific example, an explanation will be given of a case in which data is collectively written in a page comprising a first memory cell MC1, a second memory cell MC2, and a third memory cell MC3 all sharing the word line WL1 and indicated in a dashed rectangle. In this case, it is supposed that pieces of data "00", "01", and "11" are respectively written in the memory cells MC1, MC2, and MC3 retaining data "11" and in a level A that the resistive state is the highest.

Figure 6:
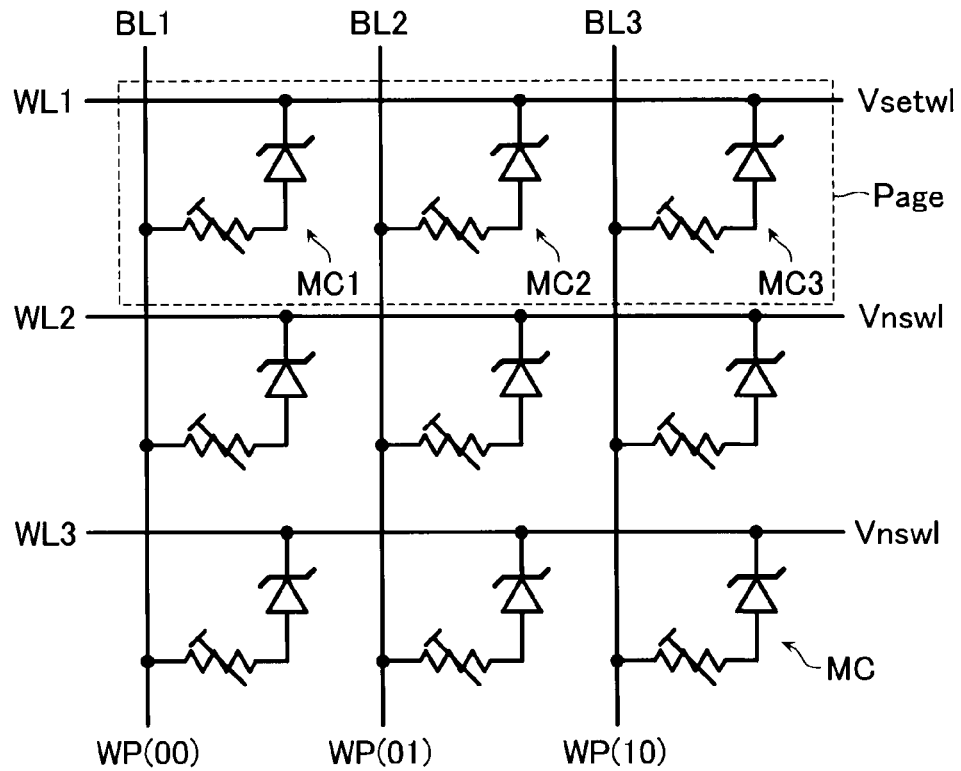
FIG. 6 is an equivalent circuit diagram showing a part of the memory cell array in the embodiment.
Figure 7:
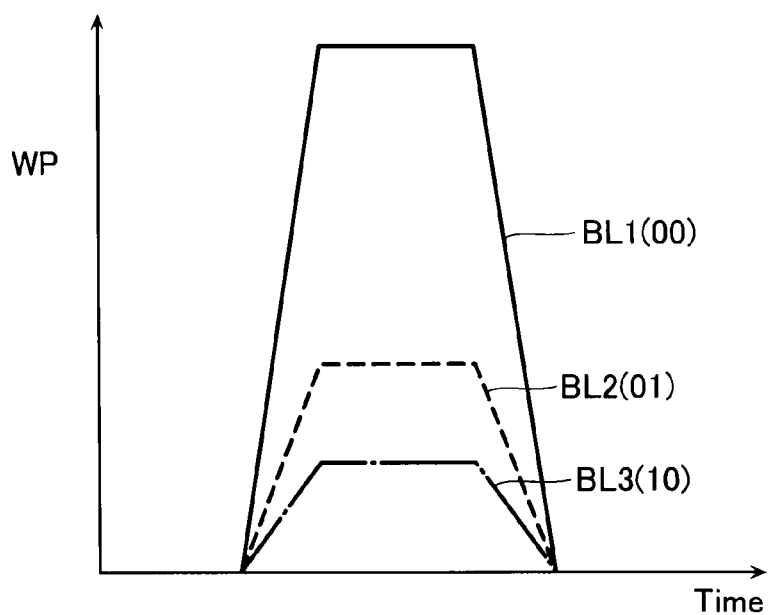
FIG. 7 is a waveform diagram showing a first generation example of a writing pulse in the embodiment.

FIG. 7 is a waveform diagram showing a first generation example of a writing pulse at the time of writing in data in the page surrounded by the dashed line in FIG. 6.

This case is an example in which electrical energy is adjusted by the height of the writing pulse WP. In this case, the write-in data into the memory cell MC1 is "00", i.e., the resistive state of the memory cell MC1 is set to be level D, so that the highest writing pulse WP is applied to the bit line BL1. The write-in data into the memory cell MC2 is "01", i.e., the resistive state of the memory cell MC2 is set to be level B one-stage lower than level A, so that a writing pulse WP having a height one-stage lower than the bit line BL1 is applied to the bit line BL2. The write-in data into the memory cell MC3 is "10", i.e., the resistive state of the memory cell MC3 is set to level C one-stage lower than B level, so that a writing pulse WP having a height one-stage lower than the bit line BL2 is applied to the bit line BL3. In this fashion, as the plurality of writing pulses WP are simultaneously applied, different electric energies are given between the word line WL1 and individual bit lines BL1 to BL3, and the resistive states of the memory cells MC1, MC2, and MC3 belonging to the page are changed to levels A, B, and C, respectively, from level D in accordance with the write-in data. Thus way, a batch writing operation to the page completes.

A non-selected-word-line voltage Vnsw1 higher than the voltage pulse WP applied to the bit line BL1 is applied to the word lines WL2, WL3 belonging to a non-selected page. Accordingly, the diode Di of the memory cell MC belonging to the non-selected page is reversely biased, so that no electrical energy is applied thereto, and no transition of a resistive state occurs.

Figure 8:
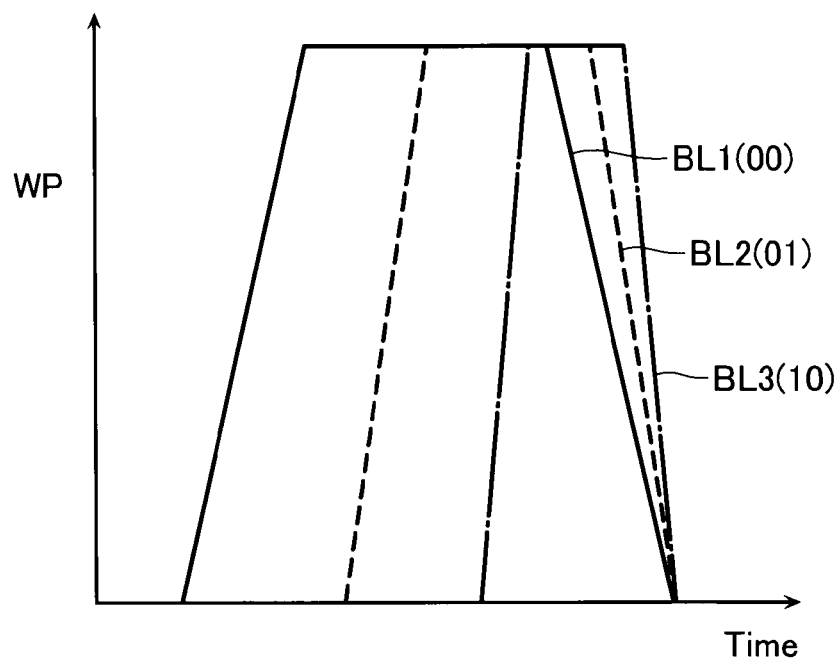
FIG. 8 is a waveform diagram showing a second generation example of a writing pulse in the embodiment.
Figure 9:
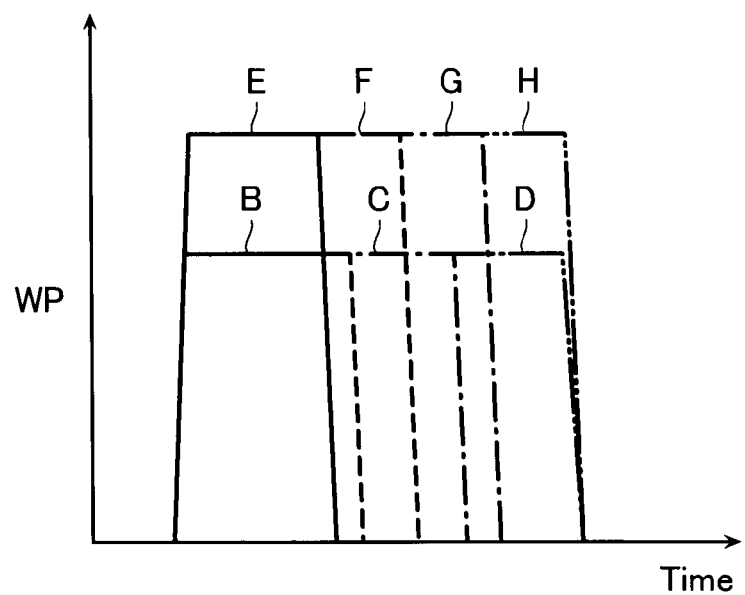
FIG. 9 is a waveform diagram showing a third generation example of a writing pulse in the embodiment.

FIG. 8 is a waveform diagram showing a second generation example of a writing pulse when data is written in the page surrounded by the dashed line in FIG. 6.

This case is an example in which electrical energy is adjusted by the width of a writing pulse WP. Like the case shown in FIG. 7, a pulse WP having the widest width is applied to the bit line BL1 connected to the memory cell MC1. A writing pulse WP having a width one-stage narrower than that of the bit line BL1 is applied to the bit line BL2 connected to the memory cell MC2. A writing pulse WP having a width one-stage narrower than that of the bit line BL2 is applied to the bit line BL3 connected to the memory cell MC3. Accordingly, electrical energies in accordance with respective pieces of data are applied between the word line WL1 and respective bit lines BL1 to BL3, and thus batch writing to the page completes.

It is necessary that such writing pulses WP have a voltage and a pulse width which can change the respective resistive states of the variable resistive elements VR to levels D, C, and B shown in FIG. 5A.

FIG. 8 shows an example of a writing pulse WP for eight-value data, and electrical energy is changed by a combination of a pulse width and a pulse height. That is, when it is supposed that an erasing state ("111") is level A, then, if input data is "000", a writing pulse H having the highest pulse height and the widest pulse width is selected, and if input data is "110", a writing pulse B having the lowest pulse height and the narrowest pulse width is selected.

In this fashion, with a selected word line WL being caused to be a constant word-line selecting voltage Vsetw1, writing pulses WP which are electrical energies based on write-in data are simultaneously applied to respective bit lines BL, thereby realizing batch data writing in memory cells MC belonging to a page.

As explained above, according to the embodiment, data writing can be carried out page by page, so that it is possible to realize a nonvolatile semiconductor memory device which enables writing of multivalued data at a fast speed.

Although the embodiment of the present invention has been explained, the present invention is not limited to the foregoing embodiment, and can be changed and modified in various forms without departing from the scope and the spirit of the present invention. For example, the same effect can be accomplished from a nonvolatile memory which has memory cells each including a non-ohmic element like a transistor and which is able to perform a bipolar operation.

What is claimed is:

1. A nonvolatile semiconductor memory device comprising:
    a memory cell array including plural first and second wirings intersecting one another, and memory cells each provided at individual intersection between the first wiring and the second wiring, the memory cell comprising a variable resistive element, and predetermined numbers of the memory cells sharing the same first wiring to configure a page;
    a first control circuit configured to select a page of the memory cell array subjected to data-writing based on an address, and to supply a constant voltage to the first wiring belonging to the selected page;
    a writing-voltage generating circuit configured to generate plural kinds of writing voltages for programming a resistance of the variable resistive element to one of three or more values based on a write-in data specifying three or more values; and
    a second control circuit configured to select the page of the memory cell array subjected to data-writing based on the address, and to supply the writing voltages generated by and output from the writing-voltage generating circuit to predetermined numbers of the respective second wirings belonging to the selected page.

2. The nonvolatile semiconductor memory device according to claim 1, wherein the writing-voltage generating circuit is a pulse generator which simultaneously generates and outputs, as the writing voltages, plural kinds of writing pulses each having a different pulse height.

3. The nonvolatile semiconductor memory device according to claim 2, wherein the pulse generator simultaneously generates and outputs plural kinds of writing pulses each having a different pulse width.

4. The nonvolatile semiconductor memory device according to claim 1, wherein the writing-voltage generating circuit is a pulse generator which simultaneously generates and outputs, as the writing voltages, plural kinds of writing pulses each having a different pulse width.

5. The nonvolatile semiconductor memory device according to claim 1, wherein the memory cell further comprises a non-ohmic element connected to the variable resistive element in series.

6. The nonvolatile semiconductor memory device according to claim 5, wherein the non-ohmic element of the memory cell is a diode.

7. The nonvolatile semiconductor memory device according to claim 6, wherein
    the diode of the memory cell has an anode connected to the second wiring and has a cathode connected to the first wiring, and
    the writing voltage is higher than a voltage of the first wiring.

8. The nonvolatile semiconductor memory device according to claim 7, wherein the first control circuit supplies a voltage higher than the writing voltage to the first wiring which does not belong to the selected page.

9. A nonvolatile semiconductor memory device comprising:
a memory cell array including plural first and second wirings intersecting one another, and memory cells each provided at individual intersection between the first wiring and the second wiring, the memory cell comprising a variable resistive element configured to store, as data, one of three or greater resistance values in a nonvolatile manner, and predetermined numbers of the memory cells sharing the same first wiring to configure a page;
an input buffer configured to store an address and data both input externally;
a first control circuit configured to select the first wiring connected to the memory cells configuring a page of the memory cell array subjected to data-writing based on an address input via the input buffer, and to supply a constant voltage to the selected first wiring;
a pulse generator configured to simultaneously generate plural kinds of writing pulses, each of the writing pulses being one of three kinds or more of writing voltages corresponding to data specifying three or more values, to be supplied to the plurality of respective second wirings connected to the memory cells configuring a page subjected to data-writing based on data input via the input buffer; and
a second control circuit configured to select the plurality of second wirings connected to the memory cells configuring the page of the memory cell subjected to data-writing based on the address input via the input buffer, and to supply the plural kinds of writing pulses generated by the pulse generator to the respective plural selected second wirings.

10. The nonvolatile semiconductor memory device according to claim 9, wherein the memory cell further comprising a diode connected to the variable resistive element in series.

11. The nonvolatile semiconductor memory device according to claim 10, wherein
the diode has an anode connected to the second wiring and has a cathode connected to the first wiring, and
the writing pulse has a height higher than a height of a voltage of the first wiring.

12. The nonvolatile semiconductor memory device according to claim 11, wherein the first control circuit supplies a voltage higher than a height of the writing pulse to the first wiring which does not belong to the page of the memory cell array subjected to data-writing.

13. A nonvolatile semiconductor memory device comprising:
a memory cell array including plural first and second wiring intersecting one another, and memory cells each provided at individual intersection between the first wiring and the second wiring, the memory cell comprising a variable resistive element;
a writing-voltage generating circuit configured to generate and output plural kinds of writing voltages for programming a resistance of the variable resistive element to one of three or more values based on write-in data specifying three or more values; and
a writing circuit configured to write pieces of data in the respective memory cells using the respective writing voltages output from the writing-voltage generating circuit, and
the writing circuit configured to select the plural memory cells commonly connected to the same first wiring among the plurality of memory cells, and to supply the writing voltages on the basis of pieces of data to be written in the plural respective selected memory cells to the respective second wirings connected to the individual memory cells.

14. The nonvolatile semiconductor memory device according to claim 13, wherein the writing circuit includes a pulse generator which simultaneously generates and outputs, as the writing voltages, plural kinds of writing pulses each having a different pulse height.

15. The nonvolatile semiconductor memory device according to claim 14, wherein the pulse generator simultaneously generates and outputs plural kinds of writing pulses each having a different pulse width.

16. The nonvolatile semiconductor memory device according to claim 13, wherein the writing circuit includes a pulse generator which simultaneously generates and outputs, as the writing voltages, plural kinds of writing pulses each having a different pulse width.

17. The nonvolatile semiconductor memory device according to claim 13, wherein the memory cell further comprises a non-ohmic element connected to the variable resistive element in series.

18. The nonvolatile semiconductor memory device according to claim 17, wherein the non-ohmic element is a diode.

19. The nonvolatile semiconductor memory device according to claim 18, wherein
the diode has an anode connected to the second wiring and has a cathode connected to the first wiring, and
the writing voltage is higher than a voltage of the first wiring.

20. The nonvolatile semiconductor memory device according to claim 19, wherein the writing circuit supplies a voltage higher than the writing voltage to the first wiring which is not connected to the selected memory cell.

* * * * *